United States Patent
Mazzotta et al.

(10) Patent No.: US 11,479,468 B2
(45) Date of Patent: Oct. 25, 2022

(54) COMPOSITION COMPRISING CARBON NANOTUBES AND NON-CONJUGATED POLYMER MOLECULES AND METHOD OF PREPARATION THEREOF

(71) Applicant: Oxford University Innovation Limited, Oxford (GB)

(72) Inventors: Giulio Mazzotta, Oxford (GB); Robin John Nicholas, Oxford (GB); Moritz Kilian Riede, Oxford (GB)

(73) Assignee: OXFORD UNIVERSITY INNOVATION LIMITED, Oxford (GB)

( * ) Notice: Subject to any disclaimer, the term of this patent is extended or adjusted under 35 U.S.C. 154(b) by 39 days.

(21) Appl. No.: 16/767,625

(22) PCT Filed: Nov. 30, 2018

(86) PCT No.: PCT/GB2018/053481
§ 371 (c)(1),
(2) Date: May 28, 2020

(87) PCT Pub. No.: WO2019/106384
PCT Pub. Date: Jun. 6, 2019

(65) Prior Publication Data
US 2020/0369524 A1   Nov. 26, 2020

(30) Foreign Application Priority Data

Nov. 30, 2017   (GB) .................................... 1719915

(51) Int. Cl.
*C01B 32/174*   (2017.01)
*C08J 3/14*   (2006.01)
(Continued)

(52) U.S. Cl.
CPC ............... *C01B 32/174* (2017.08); *C08J 3/14* (2013.01); *C08J 3/215* (2013.01); *H01G 11/36* (2013.01);
(Continued)

(58) Field of Classification Search
CPC ..... B82Y 30/00; B82Y 40/00; C01B 2202/02; C01B 2202/06; C01B 32/174;
(Continued)

(56) References Cited

U.S. PATENT DOCUMENTS 7,153,903 B1 * 12/2006 Barraza .................... C08J 5/005
524/847
7,968,660 B2 * 6/2011 Dubois .................. B82Y 40/00
526/160
(Continued)

FOREIGN PATENT DOCUMENTS

| WO | 2008/041965 | A2 | 4/2008 |
| WO | 2008/054472 | A2 | 5/2008 |
| WO | 2015/140548 | A1 | 9/2015 |

OTHER PUBLICATIONS

Saifuddin, N. et al., "Carbon Nanotubes: A Review on Structure and Their Interaction with Proteins," Journal of Chemistry, vol. 2013, 18 pages, 2013. (Year: 2013).*
(Continued)

*Primary Examiner* — Mark Kopec
*Assistant Examiner* — Jaison P Thomas
(74) *Attorney, Agent, or Firm* — Thomas | Horstemeyer, LLP

(57) ABSTRACT

A composition, which may be in the form of a film, comprises a network of carbon nanotubes. One or more non-conjugated polymer molecules are associated with individual carbon nanotubes or small bundles of carbon nanotubes in the form of polymer-nanotube complexes.

19 Claims, 5 Drawing Sheets

(51) Int. Cl.

| | |
|---|---|
| *C08J 3/215* | (2006.01) |
| *H01G 11/36* | (2013.01) |
| *H01G 11/38* | (2013.01) |
| *H01L 51/00* | (2006.01) |
| *H01L 51/42* | (2006.01) |
| *B82Y 30/00* | (2011.01) |
| *B82Y 40/00* | (2011.01) |

(52) U.S. Cl.
CPC ......... *H01G 11/38* (2013.01); *H01L 51/0049* (2013.01); *H01L 51/4266* (2013.01); *B82Y 30/00* (2013.01); *B82Y 40/00* (2013.01); *C01B 2202/02* (2013.01); *C01B 2202/06* (2013.01); *C08J 2323/08* (2013.01)

(58) Field of Classification Search
CPC .......... C08J 2323/08; C08J 3/14; C08J 3/215; H01G 11/36; H01G 11/38; H01L 51/0048; H01L 51/0049; H01L 51/4266; Y02E 10/549
See application file for complete search history.

(56) References Cited

U.S. PATENT DOCUMENTS

| | | | |
|---|---|---|---|
| 2006/0270777 A1* | 11/2006 | Wise | C08K 7/24 524/496 |
| 2007/0161729 A1 | 7/2007 | Chiou et al. | |
| 2009/0317660 A1 | 12/2009 | Heintz et al. | |
| 2011/0003965 A1* | 1/2011 | Lin | H05K 9/009 528/310 |
| 2011/0031443 A1* | 2/2011 | Park | B82Y 30/00 252/500 |
| 2016/0017103 A1* | 1/2016 | Baek | C08G 81/027 525/186 |

OTHER PUBLICATIONS

International Search Report and Written Opinion for PCT/GB2018/053481, dated Feb. 19, 2019, pp. 1-15.
UK Search Report for GB 1719915.9, dated Jun. 26, 2018, pp. 1-4.
Aihua Liu et al: "Poly(acrylic acid)-wrapped multi-walled carbon nanotubes composite solubilization in water: definitive spectroscopic properties", Nanotechnology, IOP, Bristol, GB, vol. 17, No. 12, Jun. 28, 2006 (Jun. 28, 2006), pp. 2845-2849.
Chrissafis Ket Al: "Can nanoparticles really enhance thermal stability of polymers? Part I: An overview on thermal decomposition of addition polymers", Thermochimica Acta, Elsevier Science Publishers, Amsterdam, NL, vol. 523, No. 1, Jun. 17, 2011 (Jun. 17, 2011), pp. 1-24.
George et al: "Influence of Functionalization of Multi-Walled Carbon Nanotubes on the Properties of Ethylene Vinyl Acetate Nanocomposites", Journal of Nanoscience and Nanotechnology, vol. 8, No. 4, Apr. 1, 2008 (Apr. 1, 2008), pp. 1913-1921.
Journal of Polymer Science Part B Polymer Physics, 49, 2011, Maxime et al., "Dispersion of Multiwalled Carbon Nanotubes in a Rubber Matrix Using an Internal Mixer: Effects on Rheological and Electrical Properties", pp. 1597-1604.
Macromolecular Rapid Communications, 28, 2007, Bredeau et al., "Ethylene-Norbornene Copolymerization by Carbon Nanotube-Supported Metallocene Catalysis: Generation of High-Performance Polyolefinic Nanocomposites", pp. 822-827.
RSC Advances, 5, 2015, Wang et al., "Largely improved fracture toughness of an immiscible poly (L-lactide /ethylene-co-vinyl acetate blend achieved by adding carbon nanotubes", pp. 69522-69533.

* cited by examiner

COMPOSITION COMPRISING CARBON NANOTUBES AND NON-CONJUGATED POLYMER MOLECULES AND METHOD OF PREPARATION THEREOF

CROSS-REFERENCE TO RELATED APPLICATIONS

This application is the National Stage of International Application No. PCT/GB2018/053481, filed Nov. 30, 2018, which claims priority to GB 1719915.9, filed Nov. 30, 2017, which are entirely incorporated herein by reference.

The present application concerns a composition comprising carbon nanotubes, a method of preparing a composition comprising carbon nanotubes, and applications of the composition.

Over recent years carbon nanotubes (CNTs) have attracted a lot of interest for their unique electronic, mechanical, thermal and optical properties, making them a promising candidate for conductive coatings, electronic sensors, energy conversion and storage applications.

The widespread application of CNTs is hindered by the difficulty of processing them due to their high aspect ratio and strong van der Waals interactions, making CNT solutions unstable, which is a problem.

Non-covalent complexation has been proposed as a strategy to solubilize nanotubes without altering their electronic structure. The use of conjugated polymers in this process has been used as a way to produce electronic grade films used in transistors, sensors and solar cells. This method involves the use of conjugated polymers because the π-π stacking interaction is thought to be one of the main driving mechanisms for the individual wrapping of nanotubes by polymer molecules to form complexes. However, there is the problem that the conjugated polymers are expensive.

The present invention has been devised in view of the above problems.

Accordingly, the present invention provides a composition comprising a network of carbon nanotubes, wherein one or more non-conjugated polymer molecules are associated with individual carbon nanotubes or small bundles of carbon nanotubes in the form of polymer-nanotube complexes.

Another aspect of the invention provides a composition comprising one or more non-conjugated polymer molecules associated with individual carbon nanotubes or small bundles of carbon nanotubes in the form of polymer-nanotube complexes, the polymer-nanotube complexes being dispersed in a solvent.

A further aspect of the invention provides a method of preparing a composition, the method comprising mixing carbon nanotubes with non-conjugated polymer molecules in a solvent, whereby one or more non-conjugated polymer molecules associate with individual carbon nanotubes or small bundles of carbon nanotubes to form polymer-nanotube complexes.

Further aspects of the invention are defined in the dependent claims.

According to some embodiments of the invention, a cheap non-conjugated polymer, such as Ethylene-Vinyl Acetate (EVA), can solubilize carbon nanotubes in organic solvents and produce a uniform and stable solution which can be deposited to form a conductive film. In some embodiments the conductive film can be semi-transparent.

Embodiments of the invention will now be described, by way of example only, with reference to the accompanying drawings in which.

Figure 1:
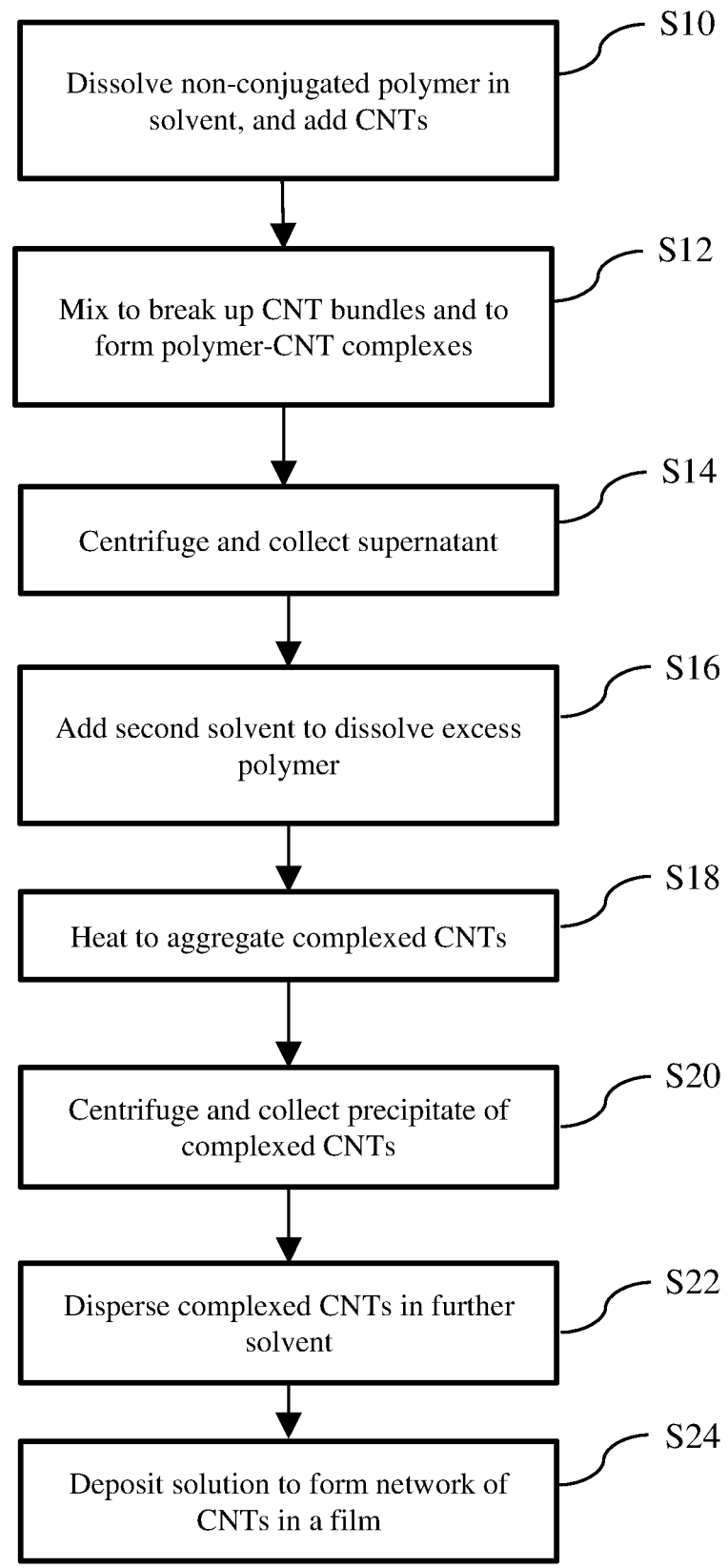
FIG. 1 is a flow chart illustrating a method of producing a composition comprising polymer-CNT complexes according to an embodiment of the invention.

A method embodying the invention is now described with reference to FIG. 1. In step S10, carbon nanotubes are added to a solution of a non-conjugated polymer. The solvent can be, for example chlorobenzene, chloroform or toluene. Then in step S12, the solution is mixed to break up bundles of CNTs and to allow the polymer to bind to nanotubes to form polymer-CNT complexes. In step S14, the mixture is centrifuged to remove non-complexed particles, and the supernatant, containing the polymer-CNT complexes is collected. Equally, the solution could be filtered and the filtrate kept and used in place of the supernatant, discarding the residue or precipitate. The supernatant (or filtrate) is diluted with a second solvent, typically an orthogonal solvent, at step S16, to induce aggregation of the nanotubes and to dissolve the excess polymer (i.e. polymer molecules not associated with a CNT). Heat is preferably applied at step S18 to assist the aggregation. The solution is centrifuged (or filtered) once more, at step S20, and the precipitate, containing the polymer-CNT complexes is collected. The above two-solvent process is a method according to an embodiment of the invention for providing polymer-CNT complexes.

At step S22 the precipitate is optionally dispersed in further organic solvent, which can be the same solvent as used in step S10, such as chlorobenzene, chloroform or toluene. The resulting solution is homogeneous and stable, remaining so for many days, such as several months or more, without the formation of CNT aggregates. The non-conjugated polymer effectively acts as surfactant to solubilize the nanotubes. In some embodiments of the invention, the ratio of CNT to polymer is greater than 1:2, such as 1:1 or more.

When desired for application, the solution can be deposited, as in Step S24, for example using any of spraying, 3D-printing, blade coating, or spin-coating, and the solvent removed to leave a network of CNTs, such as to form a semi-transparent conductive film.

Embodiments of the invention work with both single-walled carbon nanotubes (SWCNTs) and with multi-walled carbon nanotubes (MWCNTs).

More specifics of embodiments will now be described.

In one embodiment, EVA is dissolved in Chlorobenzene, and HiPCO single-walled carbon nanotubes (SWCNTs) are added to the solution and treated with an ultrasonic probe. The insoluble, non-complexed particles are removed by centrifugation and the supernatant is added to Toluene to dissolve the excess EVA. The solution is then placed on a hotplate to induce aggregation of the complexed tubes, which are subsequently collected by centrifugation. The resulting pellets of nanotubes are finally dispersed in chloroform and treated with an ultrasonic probe to homogenously disperse the tubes. The same process is equally effective when using multi-walled carbon nanotubes (MWCNTs).

According to one specific embodiment, 10 mg of Ethylene-Vinyl Acetate (EVA) pellets (ELVAX 150, Dupont) are dissolved in 20 mL of Chlorobenzene by stirring at room temperature for >24 h. 4 mg of SWCNTs produced by the HiPCO (high pressure carbon monoxide disproportionation) method (Nanointegris, purified grade) are added to the solution and treated with an ultrasonic probe for 30 min. The mixture is then centrifuged at 10000 g for 30 min to remove the non-functionalised nanotubes and other impurities. The supernatant is then the collected and added to 40 mL of Toluene, then mildly heated for 1 h to dissolve the excess polymer and induce the aggregation of functionalised tubes. The mixture is then centrifuged at 16000 g for 4 min and the precipitate, consisting of pellets of complexed nanotubes, is collected and dispersed in 40 mL of Chloroform. The solution is then treated with an ultrasonic probe for 2 min.

The same procedure is followed for MWCNTs/EVA composites, e.g. where Nanocyl MWCNTs (Nanocyl, Belgium) nanotubes are used instead of the HiPCO SWNTs.

In the preceding description, EVA is used as an example of the non-conjugated polymer. EVA is a widely used polymer to manufacture products where good mechanical and hydrophobic properties are required, food packaging, flexible hoses, footwear components or car bumpers. It is inexpensive, costing less than one cent per gram.

However, EVA is merely an example, and other suitable non-conjugated polymers can be used, such as poly(vinyl acetate), polyimide, polyethylene, poly(ethylene terephthalate), and polypropylene. The polymer can have a molecular weight of at least 5000, such as around 20000.

Non-conjugated (insulating) polymers used in embodiments of the invention generally have better environmental stability than conjugated (conductive or semi-conductive) polymers previously used. Many non-conjugated polymers, such as EVA, also have very low optical absorption, so improve the transmittance of the resulting films.

Figure 2:
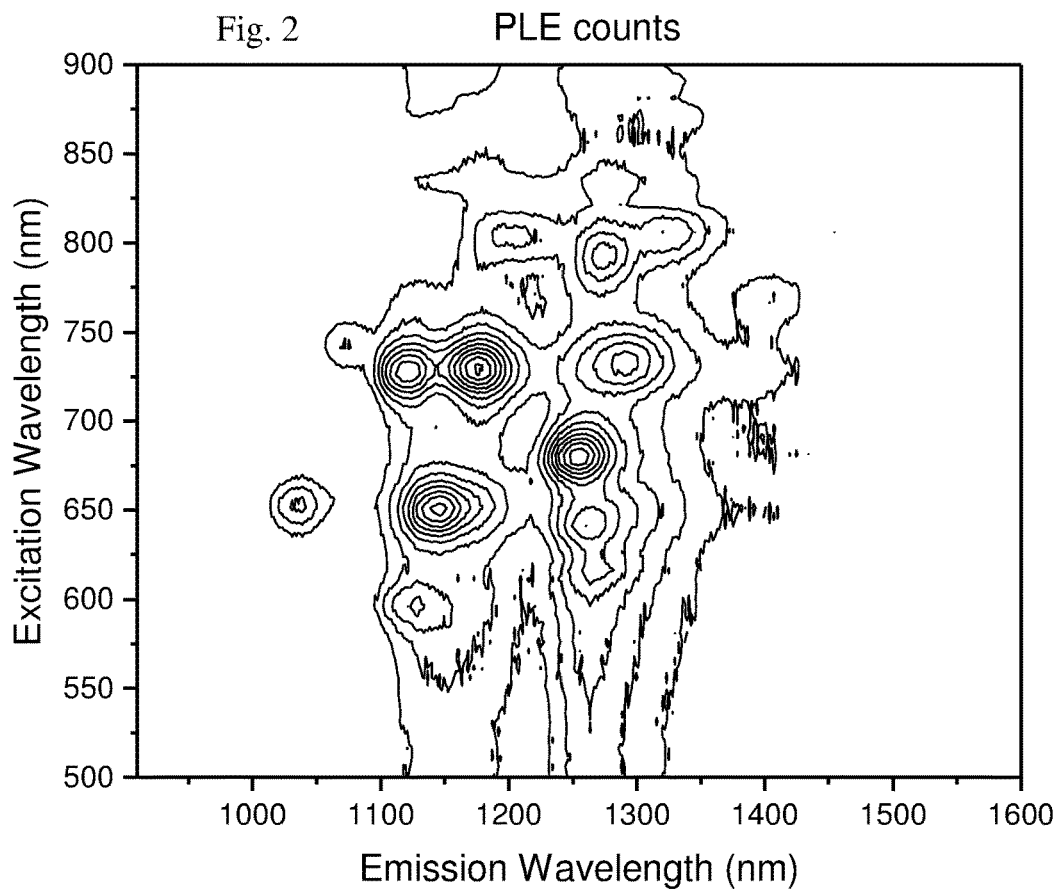
FIG. 2 is a photoluminescence excitation plot of a composition comprising polymer-CNT complexes according to an embodiment of the invention.

FIG. 2 shows a photoluminescence excitation (PLE) map of EVA complexed HiPCO-generated carbon nanotubes in chloroform solution. In this contour plot, the regions of concentric contours are around peaks in the number of PLE counts. Each peak corresponds to a form of SWCNT having a specific diameter and chiral vector.

The presence of individually resolved peaks shows the ability of the polymer to prevent the formation of big bundles, which would prevent the photoluminescence from singles tubes from being detected due to reabsorption by other species. In other words, individually resolved peaks show well dispersed nanotubes and a scarcity of bundles.

Examples of conductive films comprising a composition embodying the invention were produced as follows. EVA/CNTs films in this embodiment are deposited with a spray coater. Glass substrates (Corning Eagle XG, Thin Film Devices Inc, USA) are sequentially cleaned for 10 minutes in a sonication bath of 2% Hellmanex in de-ionized water, de-ionized water, Acetone, 2-propanol, and treated with a UV-Ozone cleaner for 10 minutes. The samples are attached to the spray coater bed with Kapton tape and kept at 100° C. for the whole spraying process. The EVA/CNTs solution is loaded in a syringe pump and delivered to a nozzle at a rate of 4 mL/min, where a 3 Bar compressed air stream atomizes the solution. The nozzle is placed at a 45 mm height from the substrates, and it rasters the substrate at a speed of 200 mm/s.

Figure 3:
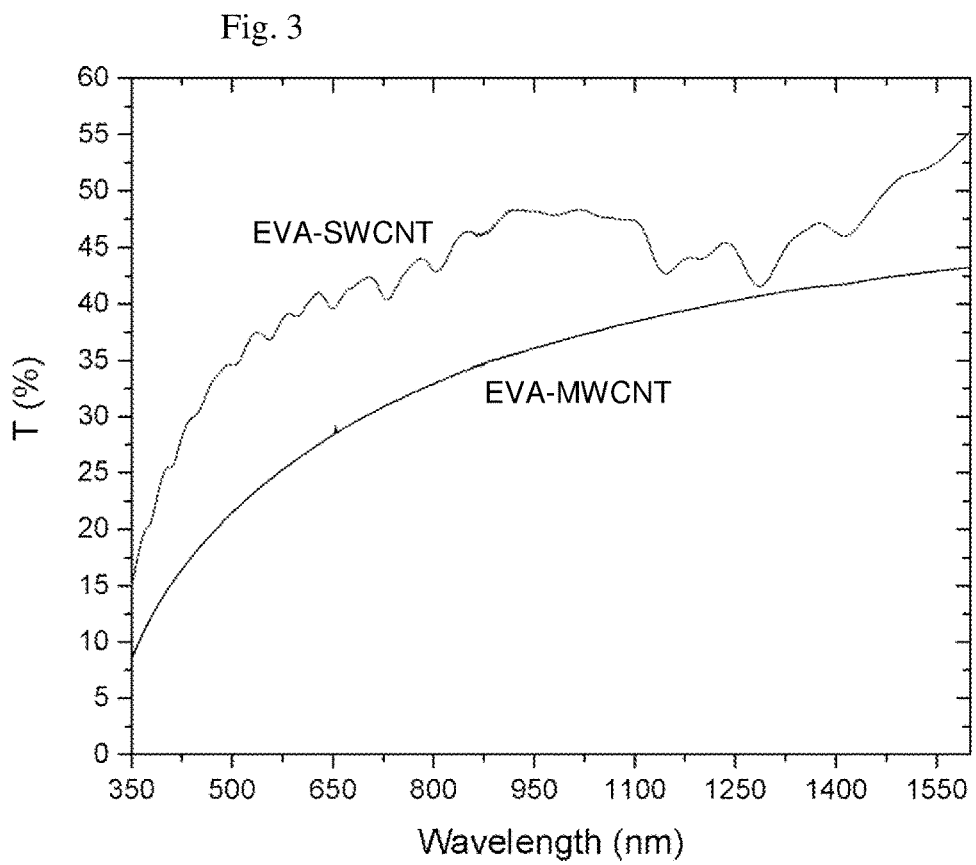
FIG. 3 shows transmittance spectra of conductive films according to an embodiment of the invention.
Figure 4:
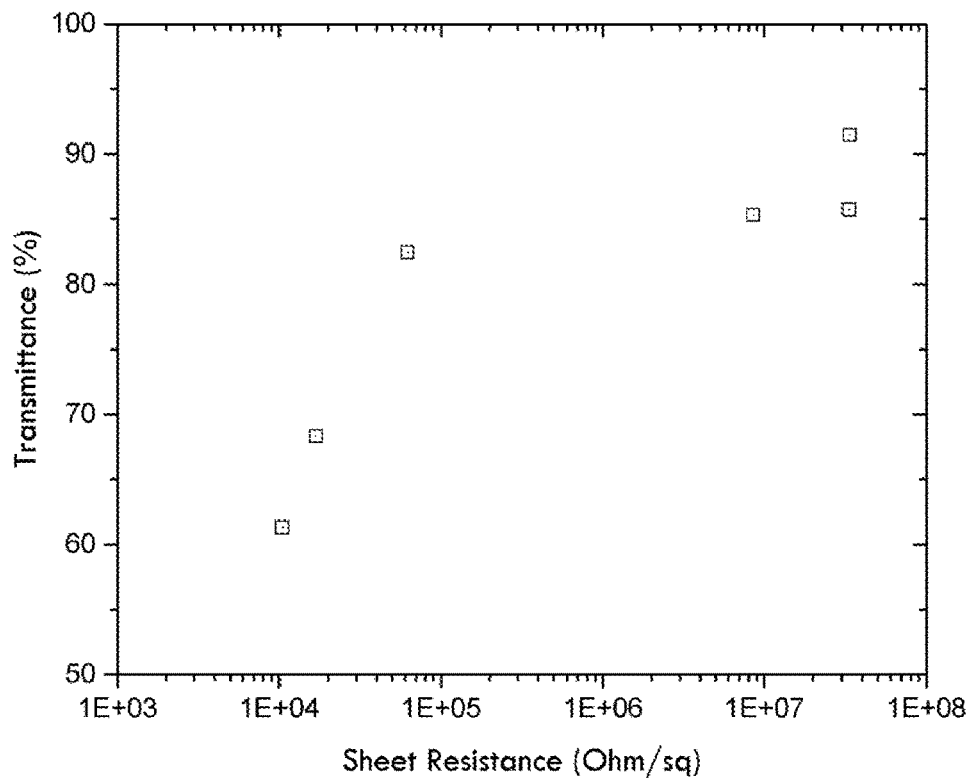
FIG. 4 is a graph of transmittance vs sheet resistance of EVA-SWCNT films.

FIG. 3 shows transmittance spectra of the sprayed EVA-SWCNTs (HiPCO) and EVA-MWCNTs on glass. The films have a 37% transmittance at 550 nm for SWCNT and 24% for MWCNT. The films have an electrical sheet resistance of 4.8 k$\Omega$/sq and 1.9 k$\Omega$/sq and a thickness of 113 nm and 250 nm respectively, corresponding to a conductivity of 18.44 S/cm (SWCNT) and 22.22 S/cm (MWCNT). This conductivity is orders of magnitude higher than previous obtained. Further experimental results of transmittance versus sheet resistance for EVA-SWCNT films and EVA-MWCNT films are given in FIGS. 4 and 5 respectively.

AFM analysis of dilute EVA-SWCNT complexes on glass show some profiles with a total height of about 3 nm, compatible with a thin polymer coating of a single nanotube; other profiles show a thicker profile of about 15-18 nm, likely due to a small bundle of tubes or a thicker polymer coating, but still enabling a clear PLE map.

After deposition of the polymer-CNT complex film, further polymer material can be deposited, such as to protect the film and to provide a smooth surface.

The polymer-CNT complex composition (such as in the form of a film) can also be treated to improve the conductivity. For example, the composition can be treated with acid to shift the Fermi level and effectively dope the CNT. In another example, the polymer-CNT complex composition can also be heated to 'burn in' the network of nanotubes and improve conduction between nanotubes. The heating can be achieved, for example, by applying microwave radiation and/or by passing electric current through the composition.

A liquid composition comprising the polymer-CNT complexes dispersed in a solvent can be distributed as a product to end users because it remains stable and homogeneous for long periods of time. In one application, this composition could be considered as a 'conductive ink', and used to create conductive circuit patterns, for example using ink-jet printing techniques. Further examples of applications are discussed below.

Figure 6:
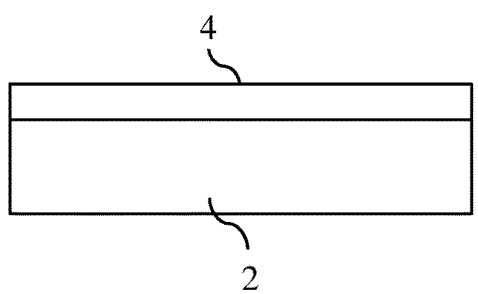
FIG. 6 is a cross-section of a film coating on a substrate according to an embodiment of the invention.

Typical applications of the polymer-CNT composition embodying the invention would involve providing a substrate 2, as illustrated in cross-section in FIG. 6, and coating it with a film 4 of the polymer-CNT composition. The film of polymer-CNT complex can be very thin, such as 1 g per square metre, and less than 1000 nm thick, such as approximately 100 nm or a few 10 s of nm thick.

In one application, the substrate 2 is glass for glazing a window. The film 4 can be an optical coating, such as an energy-saving coating to modify the emissivity of the glass. The CNTs absorb infrared light, so can avoid some heat being radiated from a building.

In another application, the substrate 2 is also glass, and the film 4 is an electric heating element. The film 4 can be in the form of a continuous 2D coating or in the form of wires. Passing current through the film 4 causes ohmic heating. This can be used to prevent freezing or misting of the glass, for example for vehicle windows or for windows of refrigerated cabinets, such as in supermarkets and bars.

In a further application, the film 4 is provided as an anti-static coating for articles used in environments sensitive to the build-up of electric charge, such as in the petrochemical industry and the semiconductor electronics industry.

In another application, the film 4 can be provided as an EM shielding layer to avoid electromagnetic interference (EMI).

The conductive properties of the film 4 can be used as an electrode, such as in a supercapacitor for energy storage. The film 4 can also be a lightweight flexible conductive coating; this is despite the use of an insulating polymer.

In some applications embodying the invention, it is advantageous for the polymer-CNT complex composition to be transparent or semi-transparent, but this is not essential to all embodiments of the invention. For example, many antistatic coating, electric circuit, EM-shielding, supercapacitor, and other applications do not require transparency, and the composition could even be opaque. The opacity can be determined by the choice of polymer, and thickness of the layer.

One further application of a composition embodying the invention, which uses both the electrical conductivity and optical transmissivity properties, is as a transparent electrode in a photovoltaic (PV) cell. One example is a recombination electrode for a tandem photovoltaic cell. In general, cells of different PV materials can be stacked, with the PV materials having different band-gaps such that they harvest different parts of the EM spectrum to create a more efficient power source. Transparent electrodes can be needed in such stacks so as not to block light from subsequent PV layers.

Due to its low cost and low water vapour transmission rate (WVTR), EVA is currently the standard encapsulation material for silicon photovoltaic modules. This means that it is particularly preferred to use EVA-CNT complexes because there will be material compatibility with electrodes comprising EVA-CNT complexes, and because EVA is stable for use in PV applications.

Figure 5:
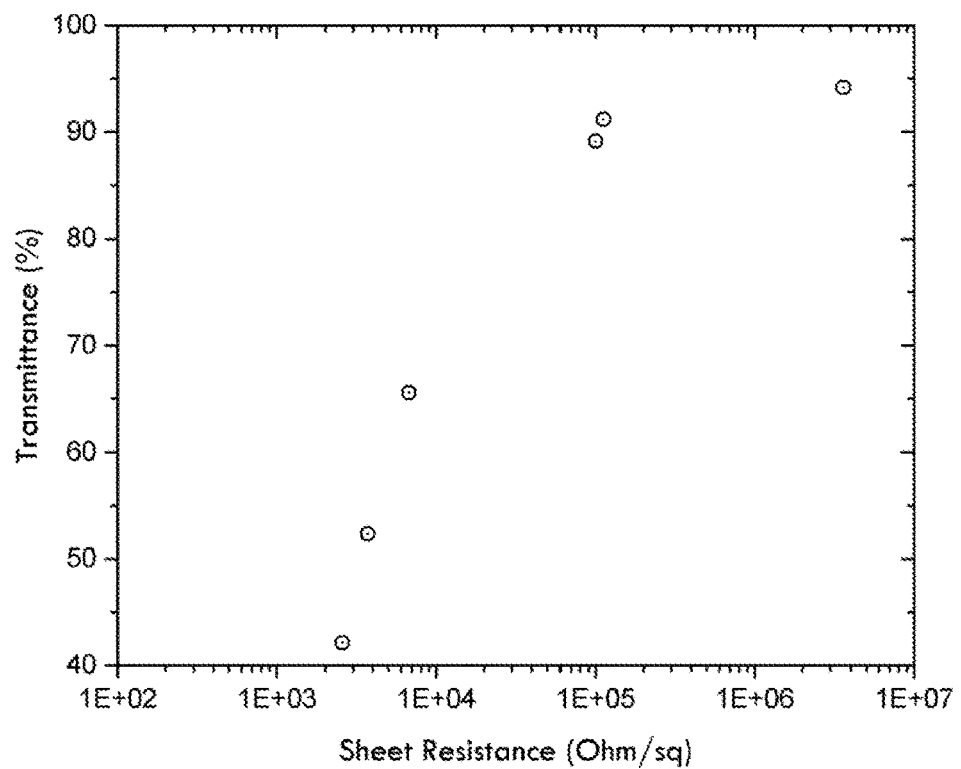
FIG. 5 is a graph of transmittance vs sheet resistance of EVA-MWCNT films.

A specific example of a PV cell was fabricated using the polymer-CNT complex composition according to an embodiment of the invention. The structure is illustrated in FIG. 5 and was fabricated as follows. A fluorine tin doped oxide coated glass (TEC 7, NGS) was cleaned with 2% Hellmanex in DI water, DI water, ethanol and treated with 5 min $O_2$ plasma. Subsequently, an electron accepting layer of $SnO_2$ was prepared. A tin (IV) chloride pentahydrate ($SnCl_4.5H_2O$) (Sigma-Aldrich) was dissolved in 2-propanol (0.05 M) and stirred for 30 min. The solution was spin-coated at 3000 rpm for 30 s and the substrates were then annealed at 100° C. for 10 min and at 180° C. for 60 min. The mixed perovskite precursor solution was obtained dissolving 1.25 M formamidinium iodide (Dyesol), 0.25 M methylammonium bromide (Dyesol), 0.25 M lead bromide (Alfa Aesar), and 1.375 M lead iodide (TCI) in a 4:1 mixture by volume of N,N-dimethyformamide (DMF) and N,N-dimethyl sulfoxide (DMSO) and stirring it for 15 min at 65° C. The perovskite deposition was done in a drybox with approximately 10% RH by spin-coating 20 μL of the precursor solution in a two-step process, spinning for 10 s at 1000 rpm and 35 s at 6000 rpm, and 10 s before the end of the second spin-coating step, the spinning substrate was quenched with 80 μL anisole (Sigma-Aldrich). Thereafter, the perovskite films were annealed at 100° C. in an oven. A layer of EVA/HiPco tubes (i.e. SWCNTs) was then deposited as described above, and a solution of 85 mg/mL of spiro-OMeTAD (Lumtec) dissolved in chlorobenzene (Sigma-Aldrich) was deposited by spin-coating at 2000 rpm for 45 s. Finally, 100 nm thick silver electrodes were deposited by vacuum sublimation in a vacuum chamber with base pressure 10-6 mbar.

Figure 8:
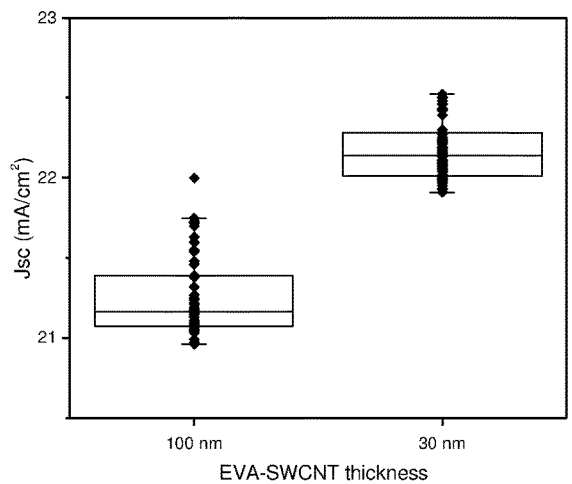
FIG. 8 shows graphs illustrating the performance of examples of the photovoltaic cell according to FIG. 5.
Figure 8:
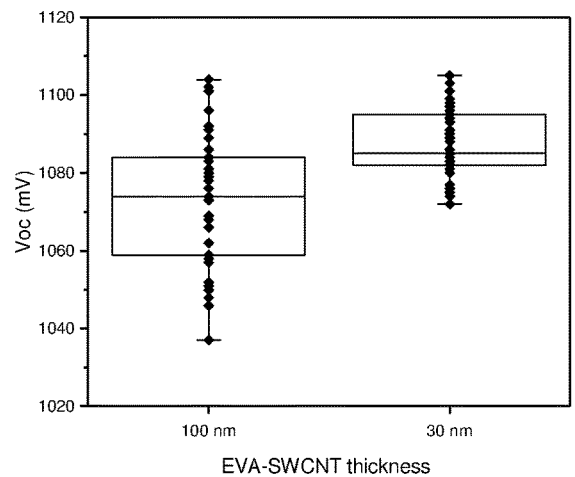
Figure 8:
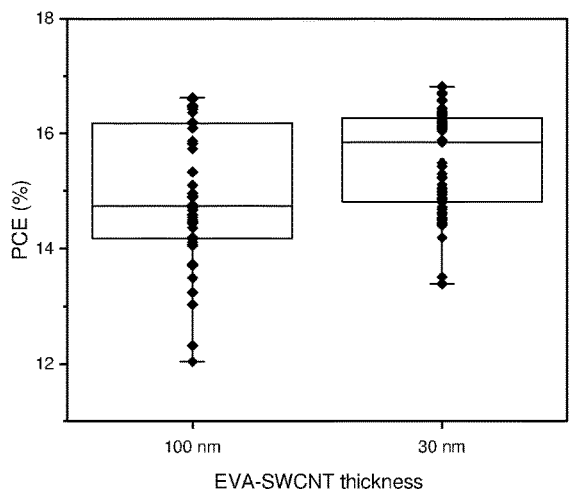
Figure 8:
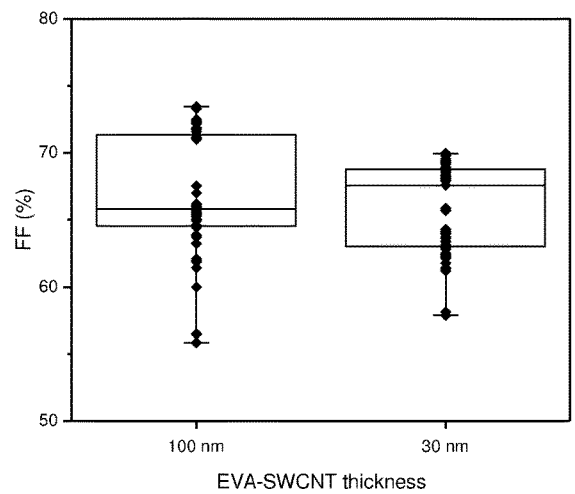

The good electronic properties of the film (despite the use of an insulating polymer), are illustrated in this example in which EVA-SWCNT tubes have been deposited on perovskite solar cells as a hole transporting layer with un-doped 2,2',7,7'-Tetrakis[N,N-di(4-methoxyphenyl)amino]-9,9'-spirobifluorene (Spiro-OMeTAD) as described above. FIG. 8 shows graphs of the performances of solar PV cells where 100 nm and 30 nm thick layers of EVA-SWCNT composition (SWCNTs were HiPCO-generated tubes) have been sprayed on top of the perovskite layer as a hole transporting material. As can be seen, a thinner layer provided a better open circuit voltage ($V_{OC}$) AND short circuit current ($J_{sc}$), likely due to a lower parasitic absorption of the back reflected light from the EVA/CNT layer, whereas a thicker layer gave a higher fill factor (FF) likely due a better coverage of solar cells. The power conversion efficiency (PCE) results are also shown.

Figure 7:
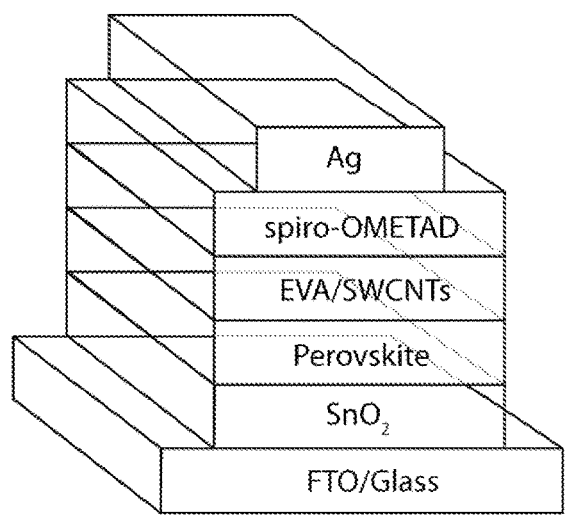
FIG. 7 is a diagrammatic illustration of the layers of a photovoltaic cell according to an embodiment of the invention comprising single-walled carbon nanotubes.
Figure 9:
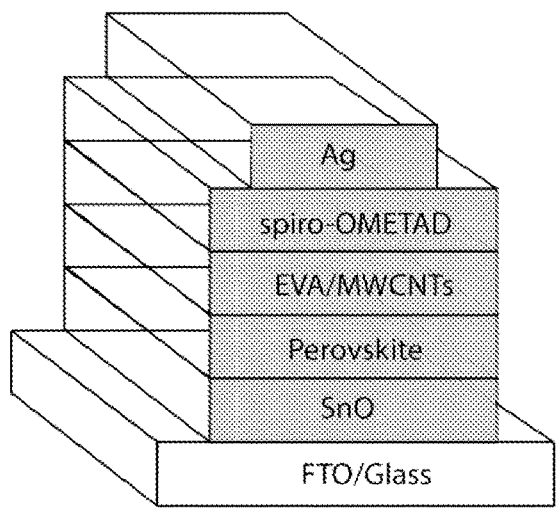
FIG. 9 is a diagrammatic illustration of the layers of a photovoltaic cell according to another embodiment of the invention comprising multi-walled carbon nanotubes.
Figure 10:
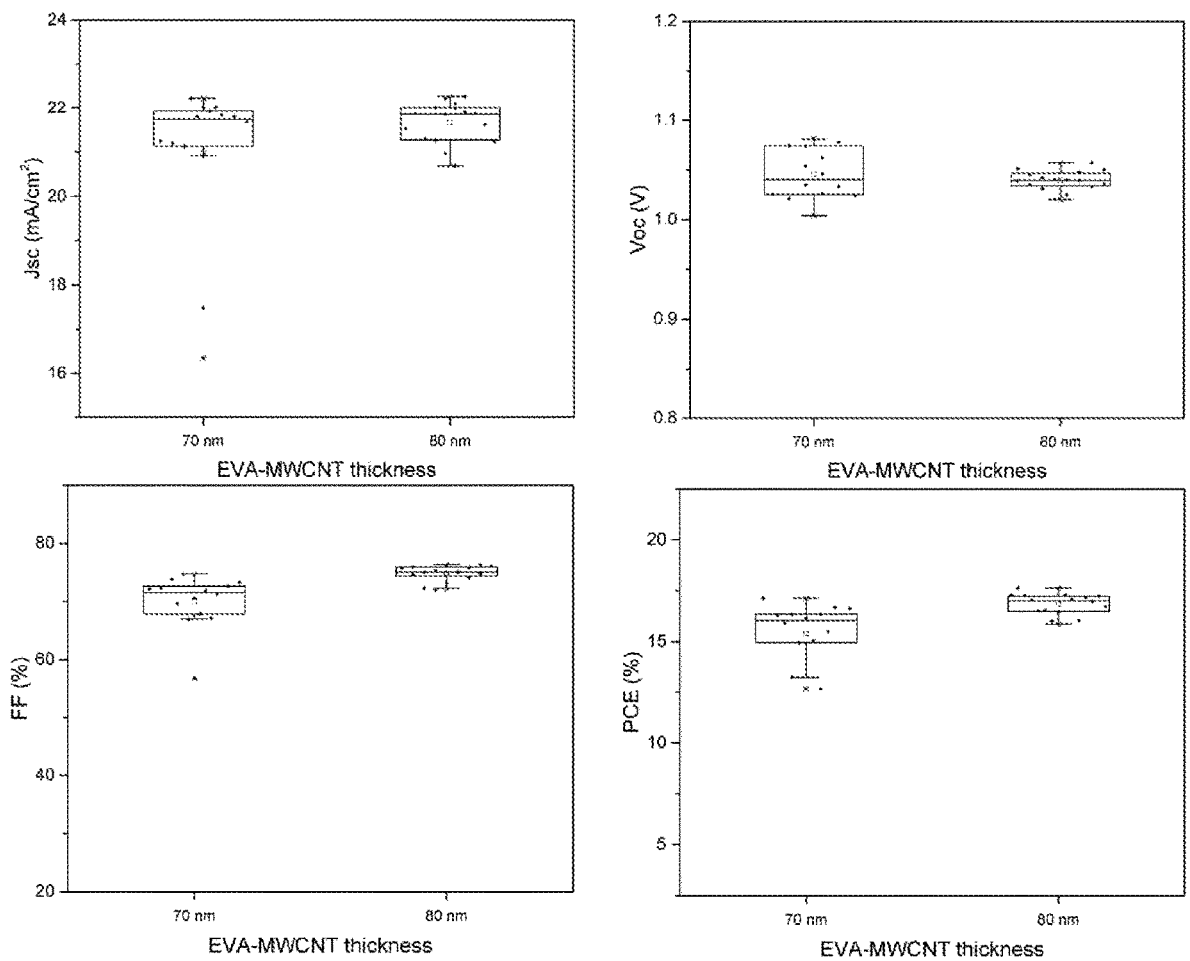
FIG. 10 shows graphs illustrating the performance of examples of the photovoltaic cell according to FIG. 9.

Another example of a PV cell using a composition according to an embodiment of the invention is illustrated in FIG. 9. The structure is similar to that of FIG. 7; the main difference being that a layer of EVA-MWCNTs is used as a hole transporting material. Examples of the structure of FIG. 9 were fabricated as follows. A tin (IV) chloride pentahydrate ($SnCl_4.5H_2O$) (Sigma-Aldrich) was dissolved in 2-propanol (0.05 M) and stirred for 30 min. The solution was spin-coated at 3000 rpm for 30 s and the substrates were then annealed at 100° C. for 10 min and at 180° C. for 60 min. The films were put in a vacuum oven at 70° C. for 3 h immersed in a solution prepared as follows: 500 mg urea (Sigma-Aldrich) was dissolved in 40 ml deionized water, followed by the addition of 10 ml 3-mercaptopropionic acid (Sigma-Aldrich) and 0.5 ml hydrochloric acid (37 wt %). Finally, tin(II) chloride dihydrate (Sigma-Aldrich) was dissolved in the solution at 0.002 M and stirred for 2 min. The substrates were then put in a sonication bath of deionized water for 2 min, dried with nitrogen and annealed for 1 h at 180° C.

The perovskite precursors solution was obtained by dissolving formamidinium iodide (FAI; Dyesol), cesium iodide (CsI; Alfa Aesar), lead iodide ($PbI_2$ TCI), lead bromide ($PbBr_2$; TCI) to obtain a 1.45 M $FA_{0.83}Cs_{0.17}Pb(I_{0.9}Br_{0.1})_3$ composition in a 4:1 mixture by volume of anhydrous N,N-Dimethylformamide and dimethyl sulfoxide (Sigma-Aldrich). The perovskite deposition was done in a drybox with approximately 10% RH by spin-coating 20 μL of the precursor solution in a two-step process, spinning for 10 s at 1000 rpm and 35 s at 6000 rpm, and 10 s before the end of the second spin-coating step, the spinning substrate was quenched with anisole (Sigma-Aldrich). The films were then annealed at 100° C. for 60 min. Thereafter, the perovskite films were annealed at 100° C. in an oven. A layer of EVA/MWCNT tubes was then deposited as described above, and a solution of 85 mg/mL of spiro-OMeTAD (Lumtec) dissolved in chlorobenzene (Sigma-Aldrich) was deposited by spin-coating at 2000 rpm for 45 s. Finally, 100 nm thick silver electrodes were deposited by vacuum sublimation in a vacuum chamber with base pressure $10^{-6}$ mbar.

The invention claimed is:

1. A composition comprising a network of carbon nanotubes, wherein one or more polymer molecules are associated with individual carbon nanotubes or bundles of two or more carbon nanotubes in the form of polymer-nanotube complexes, the polymer molecules being non-conjugated polymer molecules, wherein the conductivity of the composition is greater than 0.1 S/cm, and wherein the composition is in the form of a film having a thickness less than 1000 nm.

2. The composition according to claim 1 in the form of a film.

3. The composition according to claim 1, having a conductivity of greater than 1.0 S/cm.

4. The composition according to claim 1, wherein the carbon nanotubes are single-walled and/or multi-walled.

5. The composition according to claim 1, wherein the polymer molecules comprise at least one of ethylene-vinyl acetate, poly(vinyl acetate), polyimide, polyethylene, poly(ethylene terephthalate), or polypropylene.

6. A composition comprising one or more polymer molecules associated with individual carbon nanotubes or bundles of two or more carbon nanotubes in the form of polymer-nanotube complexes, the polymer molecules being non-conjugated polymer molecules, the polymer-nanotube complexes being dispersed in a liquid consisting of an organic solvent.

7. A method of preparing a composition, the method comprising mixing carbon nanotubes with non-conjugated polymer molecules in a solvent, whereby one or more polymer molecules associate with individual carbon nanotubes or bundles of two or more carbon nanotubes to form polymer-nanotube complexes, the polymer molecules being non-conjugated polymer molecules,
wherein the method further comprises:
dissolving polymer molecules not associated with a carbon nanotube using a second solvent;
heating to aggregate the polymer-nanotube complexes; and
centrifuging to precipitate and collect the polymer-nanotube complexes or filtering to collect the polymer-nanotube complexes.

8. The method according to claim 7, wherein the mixing is performed in a first solvent, the method further comprises centrifuging the mixture and collecting the supernatant containing the polymer-nanotube complexes, or the method further comprises filtering the mixture and collecting the filtrate containing the polymer-nanotube complexes.

9. The method according to claim 7, further comprising dispersing the complexed carbon nanotubes in further solvent.

10. The method according to claim 7, further comprising depositing the solution and removing the solvent to form a network of carbon nanotubes.

11. The method according to claim 10, wherein the depositing step comprises one of: spraying, 3D-printing, blade coating, or spin-coating.

12. The method of claim 7, wherein the polymer molecules comprise at least one of ethylene-vinyl acetate, poly(vinyl acetate), polyimide, polyethylene, poly(ethylene terephthalate), or polypropylene.

13. The method of claim 7, further comprising using the polymer nanotube complexes to prepare: a photovoltaic cell comprising a conductive layer or electrode; an anti-static coating; an electric heating element for a window; a supercapacitor; or a window coating.

14. A photovoltaic cell comprising a conductive layer or electrode comprising a composition,
wherein the composition comprises a network of carbon nanotubes, wherein one or more polymer molecules are associated with individual carbon nanotubes or bundles of two or more carbon nanotubes in the form of polymer-nanotube complexes, the polymer molecules being non-conjugated polymer molecules, and wherein the conductivity of the composition is greater than 0.1 S/cm.

15. The photovoltaic cell according to claim 14 wherein the photovoltaic cell is a tandem cell or stacked cell.

16. An anti-static coating comprising a composition,
wherein the composition comprises a network of carbon nanotubes, wherein one or more polymer molecules are associated with individual carbon nanotubes or bundles of two or more carbon nanotubes in the form of polymer-nanotube complexes, the polymer molecules being non-conjugated polymer molecules, and wherein the conductivity of the composition is greater than 0.1 S/cm.

17. An electric heating element for a window comprising a composition,
wherein the composition comprises a network of carbon nanotubes, wherein one or more polymer molecules are associated with individual carbon nanotubes or bundles of two or more carbon nanotubes in the form of polymer-nanotube complexes, the polymer molecules being non-conjugated polymer molecules, and wherein the conductivity of the composition is greater than 0.1 S/cm.

18. A supercapacitor comprising a composition,
wherein the composition comprises a network of carbon nanotubes, wherein one or more polymer molecules are associated with individual carbon nanotubes or bundles of two or more carbon nanotubes in the form of polymer-nanotube complexes, the polymer molecules being non-conjugated polymer molecules, and wherein the conductivity of the composition is greater than 0.1 S/cm.

19. A window coating comprising a composition,
wherein the composition comprises a network of carbon nanotubes, wherein one or more polymer molecules are associated with individual carbon nanotubes or bundles of two or more carbon nanotubes in the form of polymer-nanotube complexes, the polymer molecules being non-conjugated polymer molecules, and wherein the conductivity of the composition is greater than 0.1 S/cm.

* * * * *